US010431567B2

(12) United States Patent
Chan et al.

(10) Patent No.: US 10,431,567 B2
(45) Date of Patent: Oct. 1, 2019

(54) WHITE CERAMIC LED PACKAGE

(75) Inventors: Alex Chi Keung Chan, Sheung Shui (HK); Charles Chak Hau Pang, Fanling (HK); Victor Yue Kwong Lau, Hong Kong (CN)

(73) Assignee: CREE, INC., Durham, NC (US)

( * ) Notice: Subject to any disclaimer, the term of this patent is extended or adjusted under 35 U.S.C. 154(b) by 0 days.

(21) Appl. No.: 12/939,096

(22) Filed: Nov. 3, 2010

(65) Prior Publication Data
US 2012/0104426 A1 May 3, 2012

(51) Int. Cl.
*H01L 33/50* (2010.01)
*H01L 25/075* (2006.01)
(Continued)

(52) U.S. Cl.
CPC ........ *H01L 25/0753* (2013.01); *H01L 33/486* (2013.01); *H01L 33/62* (2013.01);
(Continued)

(58) Field of Classification Search
USPC .......................................................... 257/89
See application file for complete search history.

(56) References Cited

U.S. PATENT DOCUMENTS 4,946,547 A 8/1990 Palmour
5,200,022 A 4/1993 Kong
(Continued)

FOREIGN PATENT DOCUMENTS

CN 1875491 12/2006
CN 1875495 12/2006
(Continued)

OTHER PUBLICATIONS

International Search Report and Written Opinion for Appl. No. PCT/CN2010/001864, dated Nov. 22, 2010.
(Continued)

*Primary Examiner* — Abul Kalam
(74) *Attorney, Agent, or Firm* — Ferguson Case Orr Paterson LLP

(57) ABSTRACT

The present invention is directed to leadless LED packages and LED displays utilizing white ceramic casings and thin/low profile packages with improved color mixing and structural integrity. In some embodiments, the improved color mixing is provided, in part, by the white ceramic package casing, which can help reflect light emitted from each LED in many directions away from the device. The non-linear arrangement of the LEDs can also contribute to improved color-mixing. The improved structural integrity can be provided by various features in the bond pads that cooperate with the casing for a stronger package structure. Moreover, in some embodiments the thinness/low profile of each package is attributed to its leadless structure, with the bond pads and electrodes electrically connected via through-holes. In some embodiments, the structural integrity of the package can also be attributed to indentations along its sides, which do not enable as much plating material to accumulate at the sides and helps package cutting processes during manufacture. The indentations can also contribute to displays having more tightly and densely packed LED arrays.

42 Claims, 4 Drawing Sheets

(51) Int. Cl.
*H01L 33/48* (2010.01)
*H01L 33/62* (2010.01)

(52) U.S. Cl.
CPC .............. *H01L 2224/48091* (2013.01); *H01L 2224/73265* (2013.01); *H01L 2924/09701* (2013.01)

(56) References Cited

U.S. PATENT DOCUMENTS

| | | | |
|---|---|---|---|
| 5,266,617 A | 11/1993 | Lin | 257/89 |
| 5,266,817 A | 11/1993 | Lin | |
| RE34,861 E | 2/1995 | Davis | |
| 6,624,491 B2 | 9/2003 | Waitl | 257/434 |
| 6,813,853 B1 | 11/2004 | Tucker | |
| 7,102,601 B2 | 9/2006 | Devos | 257/88 |
| 7,394,148 B2 | 7/2008 | Karnezos | 257/686 |
| 8,288,793 B2 | 10/2012 | Kim et al. | 257/99 |
| 8,827,479 B2 | 9/2014 | Kobayashi et al. | 362/97 |
| 9,711,489 B2 | 7/2017 | Pang | |
| 2004/0046242 A1 | 3/2004 | Asakawa | 257/678 |
| 2004/0079957 A1* | 4/2004 | Andrews et al. | 257/100 |
| 2004/0120155 A1 | 6/2004 | Suenaga | 362/362 |
| 2006/0102918 A1 | 5/2006 | Su et al. | 257/99 |
| 2007/0235845 A1 | 10/2007 | Xuan | 257/676 |
| 2007/0262328 A1 | 11/2007 | Bando | 257/79 |
| 2007/0295975 A1 | 12/2007 | Omae | 257/89 |
| 2008/0002100 A1 | 1/2008 | Kaneko | 349/65 |
| 2008/0012036 A1 | 1/2008 | Loh | 257/99 |
| 2008/0023036 A1 | 1/2008 | Loh et al. | 257/99 |
| 2008/0041625 A1 | 2/2008 | Cheong | |
| 2008/0093720 A1 | 4/2008 | Hiew et al. | 257/679 |
| 2008/0277685 A1 | 11/2008 | Kim | |
| 2009/0050907 A1 | 2/2009 | Yuan et al. | 257/88 |
| 2009/0057850 A1 | 3/2009 | Moy | |
| 2009/0072251 A1 | 3/2009 | Chan et al. | 257/89 |
| 2009/0129085 A1 | 5/2009 | Aizar et al. | 362/247 |
| 2009/0230413 A1* | 9/2009 | Kobayakawa | H01L 25/0753 257/91 |
| 2009/0283781 A1 | 11/2009 | Chan et al. | |
| 2010/0084681 A1* | 4/2010 | Nakajima et al. | 257/99 |
| 2010/0090239 A1* | 4/2010 | Lin et al. | 257/98 |
| 2010/0155748 A1 | 6/2010 | Chan | |
| 2010/0193816 A1 | 8/2010 | Liu | 257/98 |
| 2010/0237378 A1 | 9/2010 | Lin et al. | 257/99 |
| 2011/0095316 A1 | 4/2011 | Chen et al. | 257/98 |
| 2012/0235187 A1 | 9/2012 | Ng et al. | 257/98 |
| 2015/0204525 A1 | 7/2015 | Shen | |

FOREIGN PATENT DOCUMENTS

| | | |
|---|---|---|
| CN | 101071797 | 4/2007 |
| CN | 101012330 | 8/2007 |
| CN | 101164165 | 4/2008 |
| CN | 101388161 | 3/2009 |
| CN | 201294227 | 8/2009 |
| CN | 201294227 Y | 8/2009 |
| CN | 101887889 A | 11/2010 |
| CN | 102214647 | 10/2011 |
| CN | 102386307 A | 3/2012 |
| CN | 102737555 A | 10/2012 |
| CN | 202662602 U | 1/2013 |
| CN | 102945845 A | 2/2013 |
| CN | 103178192 A | 3/2013 |
| EP | 2148369 A1 | 1/2010 |
| JP | 058960 | 2/1993 |
| JP | 2004228387 | 8/2004 |
| JP | 200847916 | 2/2008 |
| JP | 200898218 | 4/2008 |
| JP | 2008218764 | 9/2008 |
| JP | 2009200403 | 9/2009 |
| TW | I245437 | 6/2006 |
| WO | WO 2010/081403 A1 | 7/2010 |
| WO | WO 2010081403 | 7/2010 |

OTHER PUBLICATIONS

U.S. Appl. No. 11/656,759, filed Jan. 22, 2007, Ashay Chitnis.
U.S. Appl. No. 11/899,790, filed Sep. 7, 2007, Ashay Chitnis.
U.S. Appl. No. 11/473,089, filed Jun. 21, 2006, Eric J. Tarsa.
Office Action from U.S. Appl. No. 12/957,225, dated Aug. 24, 2012.
International Preliminary Report and Written Opinion for PCT Patent Application No. PCT/CN2010/001864, dated Oct. 26, 2012.
Notification of Rectification from Chinese Patent Appl. No. 2013-10208431.2, dated Sep. 23, 2013.
First Notification of Rectification from Chinese Patent Appl. No. 2013-20304753.2, dated Sep. 24, 2013.
Office Action from U.S. Appl. No. 12/957,225, dated Nov. 6, 2013.
Office Action from U.S. Appl. No. 13/192,293, dated Jan. 16, 2014.
Office Action from U.S. Appl. No. 12/957,225, dated Apr. 30, 2014.
Second Notification of Rectification from Chinese Patent Appl. No. 201320304753.2, dated Jan. 2, 2014.
Office Action from Japanese Patent Appl. No. 2013-504088, dated Jul. 1, 2014.
Office Action from U.S. Appl. No. 13/904,282, dated Oct. 22, 2014.
Office Action from U.S. Appl. No. 13/192,293, dated Nov. 18, 2014.
Office Action from U.S. Appl. No. 13/192,293, dated Aug. 15, 2014.
Office Action from U.S. Appl. No. 13/192,293, dated Apr. 21, 2015.
First Office Action from Chinese Patent Appl. No. 201180053012.5, dated Jul. 3, 2015.
First Office Action from Chinese Patent appl. No. 2011800455336, dated May 29, 2015.
Second Office Action from Chinese Patent appl. No. 201010621778.6, dated Jul. 13, 2015.
Office Action from U.S. Appl. No. 13/904,282, dated Jun. 11, 2015.
Office Action from Japanese Appl. No. 2013-504088, dated Jun. 2, 2015.
Office Action from Chinese Patent Appl. No. 201010621778.6, dated Dec. 31, 2014.
Extended European Search Report from European Appl. No. 10849646.4-1551, dated Mar. 19, 2015.
Office Action from U.S. Appl. 12/957,225, dated Jan. 21, 2015.
Office Action from U.S. Appl. No. 13/904,282, dated Mar. 3, 2015.
Supplementary European Search Report from European Patent Appl. No. 10849646.4-1551/2559065, dated Apr. 9, 2015.
Office Action from U.S. Appl. No. 13/192,293, dated Jul. 31, 2015.
Response to OA from U.S. Appl. No. 13/192.293, filed Oct. 2, 2015.
Office Action from U.S. Appl. No. 13/192,293, dated Dec. 22, 2015.
Notice of Issuance from Chinese Patent Appl. No. 201010821776.6, dated Dec. 11, 2015.
Second Office Action from Chinese Patent Appl. No. 2011800455336, dated Nov. 20, 2015.
Office Action from U.S. Appl. No. 13/904,282; dated Apr. 28, 2016.
Decision of Rejection for Chinese Application No. 2011800455336; dated Jun. 14, 2016.
Office Action for U.S. Appl. No. 13/904,282; dated Nov. 21, 2016.
Notification of Reexamination for Chinese Application No. 2011800455336; dated Mar. 1, 2017.
Chinese Search Report on Application No. 2013102084312; dated Jun. 1, 2017.
First Office Action for Chinese Application No. 2013102084312; dated Jun. 16, 2017.
Office Action for U.S. Appl. No. 15/621,750; dated May 3, 2018.
Chinese Office Action for Application No. 2013102084312; dated Jun. 15, 2018.
International Search Report and Written Opinion for PCT/CN2011/077823 dated Oct. 20, 2011.
Office Action from U.S. Appl. No. 12/758,702, dated Oct. 9, 2012.
Response to OA from U.S. Appl. No. 12/758,702, filed Jan. 3, 2013.
Office Action from U.S. Appl. No. 12/758,702, dated Mar. 12, 2013.
Response to OA from U.S. Appl. No. 12/758,702, filed Jul. 12, 2013.
Office Action from U.S. Appl. No. 12/957,225, dated Mar. 25, 2013.
Response to OA from U.S. Appl. No. 12/957,225, filed May 15, 2013.
Office Action from U.S. Appl. No. 12/957,225, dated Jun. 3, 2013.
Response to OA from U.S. Appl. No. 12/957,225, filed Jun. 7, 2013.
Office Action from U.S. Appl. No. 13/192,293, dated Aug. 27, 2013.

(56) References Cited

OTHER PUBLICATIONS

Office Action from U.S. Appl. No. 12/758,702, dated Sep. 17, 2013.

* cited by examiner

WHITE CERAMIC LED PACKAGE

BACKGROUND OF THE INVENTION

Field of the Invention

The present invention relates generally to electronic packaging, and more particularly to white, thin/low profile packaging having multiple emitters.

Description of the Related Art

Light emitting diodes (LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

In recent years, there have been dramatic improvements in LED technology such that LEDs with increased brightness and color fidelity, smaller footprints, and overall improved emitting efficiency have been introduced. LEDs also have an increased operation lifetime compared to other emitters. For example, the operational lifetime of an LED can be over 50,000 hours, while the operational lifetime of an incandescent bulb is approximately 2,000 hours. LEDs can also be more robust than other light sources while consuming less power. For these and other reasons, LEDs are becoming more popular and are now being used in more and more applications that have traditionally been the realm of incandescent, fluorescent, halogen and other emitters.

Due at least in part to these improved LEDs and improved image processing technology, LEDs can be used as the light source for a variety of display types. In order to use LED chips in these types of applications, it is known in the art to enclose one or more LED chips in a package to provide environmental and/or mechanical protection, color selection, light focusing and the like. An LED package also includes electrical leads, contacts or traces for electrically connecting the LED package to an external circuit. The LED packages are commonly mounted on a printed circuit board (PCB).

Different LED packages can be used as the light source for displays, both big and small. Large screen LED-based displays are becoming more common in many indoor and outdoor locations, and smaller screen LED-based displays such as televisions, gaming machines, screens for handheld devices, and computer monitors are becoming more common in many homes, businesses, and mobile devices. These LED-based displays can comprise thousands of "pixels" or "pixel modules", each of which can contain a plurality of LEDs. The pixel modules can use high efficiency and high brightness LEDs that allow the displays to be visible from various distances and in a variety of environmental lighting conditions.

Most conventional LED based displays are controlled by a computer system that accepts an incoming signal (e.g. TV signal), and based on the particular color needed at the pixel module to form the overall display image, the computer system determines which LED(s) in each of the pixel modules is to emit light and how brightly. Conductors are provided to apply the appropriate power signal to each of the LEDs in the pixel modules. A power system can also be included that provides power to each of the pixel modules; the power to each of the LEDs can be modulated so light is emitted at the desired brightness.

The pixel modules can have as few as three or four LEDs that allow the pixel to emit many different colors of light from combinations of red, green, blue, and/or sometimes yellow light. For the display to show accurate and high quality images, the light emitted from the LEDs within each pixel module should be effectively mixed to provide a desired color. Moreover, each individual LED in a module and its respective emissions should not be readily and individually visible when a pixel module is illuminated via light emitting from one or more of its LEDs.

Thin, flat panel displays and/or small panel displays are becoming more common in both indoor and outdoor applications. As the popularity of flat and/or small panel displays rises, LED packages incorporated into such displays have necessarily become thinner/lower profile and smaller than their predecessors. The thin/low profile packages and/or small packages are expected to maintain their structural integrity during manufacture and use, but the integrity of such packages can become compromised. For example, the package structures can become deformed during the reflow process or damaged during the cutting process. Furthermore, packages may experience separation between the package casing and the bonding pads during manufacture and use.

SUMMARY OF THE INVENTION

The present invention provides leadless emitter packages for LED displays and the like that provide for improved color mixing and emission, with the emitter packages being thin/low profile for flatter applications and/or small for small panel applications. The present invention also provides emitter packages with improved structural integrity, with the packages having suitable surface area for mounting a desired number of LED chips and corresponding components.

One embodiment comprises an emitter package, with the package comprising a casing with a cavity extending into the interior of the casing from a top surface of the casing, electrically conductive bond pads integral to the casing, wherein a first set of the bond pads comprises chip carrier parts, and a second set of the bond pads comprises connection parts. A plurality of light emitting devices are arranged on the first set of bond pads, with the light emitting devices and portions of the bond pads exposed through the cavity. A plurality of electrodes are disposed on at least the bottom surface of the casing, and through-holes are provided that are integral to each of the bond pads. The through-holes extend from the bond pads through the casing to provide electrical paths between the bond pads and the electrodes.

Pursuant to another embodiment, a ceramic emitter package is provided comprising a white casing with a cavity extending into the interior of the casing from a top surface of the casing and electrically conductive bond pads integral to the casing, with a first set of the bond pads comprising chip carrier parts, and a second set of the bond pads comprising connection parts. A plurality of light emitting devices are arranged on the first set of bond pads, with the light emitting devices and portions of the bond pads exposed through the cavity. A plurality of electrodes are also provided, which are disposed at least on the bottom surface of the casing. U-shaped indentations are also provided in one or more of the side surface of the casing. One or more of the bond pads comprises features to improve the connection between the bond pads and the casing.

In accordance with yet another embodiment, a low profile emitter package is provided comprising a white ceramic casing with a cavity extending into the interior of the casing from a top surface of the casing, and electrically conductive bond pads integral to the casing, with a first set of the bond pads comprising chip carrier parts, and a second set of the bond pads comprising connection parts. A plurality of LEDs is also provided, with the LEDs arranged on the first set of bond pads, and the LEDs and portions of the bond pads exposed through the cavity. A plurality of electrodes is disposed at least on the bottom surface of the casing. Through-holes integral to each of the bond pads are also provided, with the through-holes extending from the bond pads through the casing to provide electrical paths between he bond pads and electrodes. The height of the package is less than 1.0 mm.

In yet another embodiment according to the present invention, an LED display is provided, comprising a substrate carrying an array of emitter packages, and electrically connected drive circuitry to selectively energize the array for producing visual images on the display. Each of the emitter packages comprises a white ceramic casing with a cavity extending into the interior of the casing from a top surface of the casing, and electrically conductive bond pads integral to the casing, with a first set of the bond pads comprising chip carrier parts, and a second set of the bond pads comprising connection parts. A plurality of LEDs are also provided, which are arranged on the first set of bond pads, with the LEDs and portions of the bond pads exposed through the cavity. A plurality of electrodes are disposed at least on the bottom surface of the casing. Through-holes are also provided that are integral to each of the bond pads, with the through-holes extending from the bond pads through the casing to provide electrical paths between the bond pads and the electrodes.

These and other further features and advantages of the invention would be apparent to those skilled in the art from the following detailed description, taken together with the accompanying drawings, in which:

BRIEF DESCRIPTION OF THE DRAWINGS

FIG. 5a is an end elevation view of the embodiment shown in FIG. 1, with the opposite end being substantially similar;

FIG. 5b is another end elevation view of the embodiment shown in FIG. 1, with the opposite end being substantially similar;

DETAILED DESCRIPTION OF THE INVENTION

Figure 1:
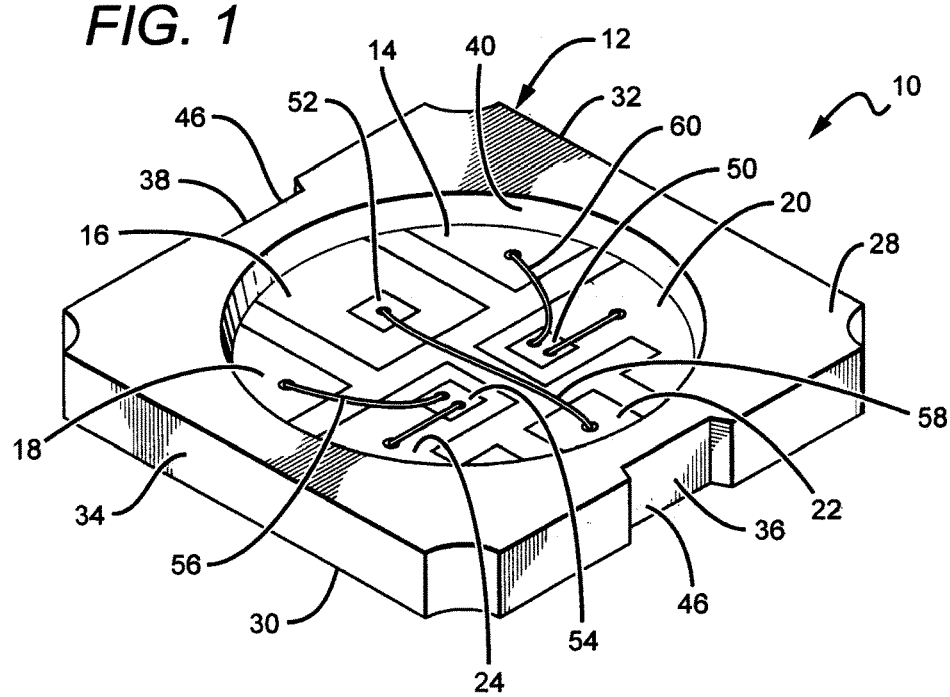
FIG. 1 is a perspective view an emitter package according to the present invention.

The present invention is described herein with reference to certain embodiments, but it is understood that the invention can be embodied in many different forms and should not be construed as limited to the embodiments set forth herein.

In some embodiments according to the present invention, structures are provided for multiple emitter packages that allow the packages to emit light with improved color mixing by providing reflective white ceramics packages and non-linearly placing the emitters within the package. Moreover, some embodiments of the present invention provide leadless packages, which can help reduce the overall depth of the package while still maintaining electrical connection between electrodes and light emitting devices via through-holes. As such, the leadless configuration may result in overall packages that are much thinner for use in lower profile applications.

Moreover, some embodiments of the present invention provide emitter packages that maintain structural integrity during manufacture and use due in part to features in the package bond pads enabling the package casing and bond pads to strongly adhere to one another, thus providing a robust connection between them. Such features may include unique bond pad layouts, with gaps of varying sizes between adjacent portions of the bond pads, cuts in the bond pads, through-holes in the bond pads, indentations in the bond pads, and the like. Structural integrity of the packages may also be realized by one or more indentations along the sides of each package, which can be provided to ease the cutting between packages that are manufactured simultaneously.

In still other embodiments, a plurality of packages may be densely packed for use in various displays. Densely-packed displays may be realized, in part, by providing leadless packages. Lead frames can be bulky, which can add to both the height and width of an overall package. A leadless package can eliminate some of this bulk and result in an overall package that is slimmer for low profile applications. A lack of leads extending out of the sides of the packages can also contribute to packages that may be more tightly packed next to one another. Densely-packed displays may also be realized by providing packages having solder pads along both their side and bottom surfaces. The placement of these pads allows for adjacent emitter packages to fit tightly together while maintaining electrical connection between them and an underlying printed circuit board (PCB).

The present invention is applicable to different types of emitter packages such as surface mount devices (SMDs) that can be used in many different lighting applications such as LED color screens or decorative lighting. Different embodiments of emitter packages are described below that utilize light emitting diodes as their emitters, but it is understood that other emitter package embodiments can use different types of emitters.

It will be understood that when an element is referred to as being "on", "connected to", "coupled to", or "in contact with" another element, it can be directly on, connected or couple to, or in contact with the other element or intervening elements may be present. In contrast, when an element is referred to as being "directly on", "directly connected to", "directly coupled to", or "directly in contact with" another element, there are no intervening elements present. Likewise, when a first element is referred to as being "in electrical contact with" or "electrically coupled to" a second element, there is an electrical path that permits current flow between the first element and the second element. The electrical path may include capacitors, coupled inductors, and/or other elements that permit current flow even without direct contact between conductive elements.

Although the terms first, second, etc. may be used herein to describe various elements, components, regions, and/or sections, these elements, components, regions, and/or sections should not be limited by these terms. These terms are only used to distinguish one element, component, region, or section from another element, component, region, or section. Thus, a first element, component, region, or section discussed below could be termed a second element, component, regions, or section without departing from the teachings of the present invention.

Embodiments of the invention are described herein with reference to cross-sectional view illustrations that are schematic illustrations of embodiments of the invention. As such, the actual thickness of components can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

FIGS. 1-11 show one possible embodiment of a leadless, thin/low profile multiple emitter package 10 according to the present invention that comprises a surface mount device (SMD). As mentioned above, it is understood that the present invention can be used with other types of emitter packages beyond SMDs. The package 10 comprises a casing 12 that carries integral bond pads 14, 16, 18, 20, 22, and 24. The bond pads are electrically conductive such that electrical signals may be transmitted to the package's light emitters. The bond pads may also assist in dissipating heat generated by the emitters in applications where a significant amount of heat is produce by the package's emitters.

The bond pads 14, 16, 18, 20, 22, and 24 can be arranged in many different ways and different numbers of parts can be utilized in different package embodiments. The package 10 is described below utilizing three emitters, and in the embodiment shown, the bond pads are arranged so each of the emitters is driven by a respective electrical signal. Also, in the embodiment shown bond pads 16, 20, and 24 comprise chip carrier parts to which a light emitting device is attached. Bond pads 14, 18, and 22 constitute connection parts, to which each of the light emitting devices are electrically connected. However, it is understood that the light emitting devices can be arranged on said bond pads in any desired configuration, thus changing which bond pads would have integral chip carrier portions and which bond pads would have integral connection portions.

In the embodiment having three emitters, there are six conductive, electrode parts comprising a pair of electrode parts for each emitter with an electrical signal applied to each of the emitters through its electrode part pair. For the package 10, the conductive, electrode parts comprise cathode and anode parts 62, 64, 66, 68, 70, and 72 (best shown in FIG. 4). Each of the electrode parts are electrically connected to a respective bond pad via through-holes 76, 78, 80, 82, 84, and 86. Pins from a standard circuit board (such as a 6-pin circuit board) as known in the art may be used in said through-holes to enable such electrical connection between the electrodes and bond pads. It is understood that the number of pins on a circuit board correspond to the number of through-holes provided for electrical connection. Alternatively, other electrically conductive materials may be disposed in the through-holes to enable such electrical connection, such as the same material used for the electrodes and/or used for the bond pads. It is understood that some embodiments can comprise less than three LEDs, while others can comprise less than six LEDs and still others can comprise more than three LEDs. The LEDs in these various embodiments can each have their own respective conductive part pair, or can share conductive parts with other LEDs. The cost and complexity of the packages can be generally lower with fewer LED chips.

The casing 12 can have many different shapes and sizes, and in the embodiment shown is generally square or rectangular, with upper and lower surfaces 28 and 30, end surfaces 32 and 34, and side surfaces 36 and 38. The upper portion of the casing further comprises a recess or cavity 40 extending from the upper surface 28 into the body of the casing 12 to portions of the bond pads 14, 16, 18, 20, 22, and 24. Indentations may be provided in the side surface 36, 38, such as the U-shaped indentations 46 shown in FIGS. 1 and 2. Such indentations may be provided to reduce the amount of electrode material disposed at the edge of the package, which can improve the cutting efficiency of emitter packages during fabrication. Additionally, by reducing the amount of electrode material at the side surface of the package, the indentations can also provide a closer fit between packages when they are arranged in side-by-side configurations for displays and the like. It is understood that the indentations may comprise any suitable shape, and may be placed in any suitable positions along the casing.

Emitters are arranged on the bond pads such that light from the emitters emits from the package 10 through the cavity 40. In some embodiments, a reflector component such as a reflective insert or ring 42 (shown in FIG. 3) may be positioned and secured along at least a portion of a side or wall 44 of the cavity 40. The effectiveness of the reflectivity of the ring 42 and the emission angle of the package can be enhanced by tapering the cavity 40 and ring carried therein inwardly toward the interior of the casing.

The shape of the cavity 40 in the embodiment shown is generally circular, but it is understood that the cavity can comprise any suitable shape according to the present invention and according to the desired emission characteristics of each package. Moreover, the bottom and top portions of the cavity 40 may comprise different shapes in order to customize the desired emission characteristics of each package.

In some embodiments, the cavity 40 may be at least partially filled with a fill material/encapsulant 48 that can protect and positionally stabilize the bond pads and the emitters carried thereon. In some instances, the fill material/encapsulant 48 may cover the emitters and the portions of the bond pads exposed through the cavity 40. The fill material/encapsulant 48 may be selected to have predetermined optical properties so as to enhance the projection of light from the LEDs, and in some embodiments is substantially transparent to the light emitted by the package's emitters. The fill material/encapsulant 48 may be substantially flat along its top surface, or can also be shaped, such as hemispheric or bullet shaped, or can be fully or partially concave in the cavity 40. The fill material/encapsulant 48 may be formed from a silicone, resin, an epoxy, a thermoplastic polycondensate, glass, and/or other suitable materials or combinations of materials. In some embodiments, materials may be added to the fill material/encapsulant 48 to enhance the emission, absorption and/or dispersion of light to and/or from the LEDs.

The casing 12 may be fabricated of material that is electrically insulating; it may also be thermally conductive. Such materials are well-known in the art and may include, without limitation, ceramics, thermoplastic polycondensates (e.g., a polyphthalamide (PPA)), resins, epoxies, and glass. The casing 12 may also be formed of a white or substantially reflective material(s) to improve the color mixing of the light emitting devices for better image quality.

The package 10 and its casing 12 may be formed and/or assembled through any one of a variety of known methods as is known in the art. For example, the casing 12 may be formed or molded around the bond pads 14, 16, 18, 20, 22, and 24, such as by injection molding. Alternatively, the casing may be formed in sections, for example, top and bottom sections, with the bond pads formed in the top section and the electrodes formed on the bottom section through methods such as metal or metal alloy plating. The top and bottom sections can then be bonded together using known methods and materials, such as by an epoxy, adhesive or other suitable joinder material.

In the illustrative embodiment depicted, the package 10 utilizes first, second and third LEDs 50, 52, 54, each of which can emit the same color of light or different color of light than the others. In the embodiment shown, the LEDs 50, 52, 54 emit green, red, and blue colors, respectively, so that when appropriately energized the LEDs produce in combination a substantially full range of colors. Further, when appropriately energized, the LEDs 50, 52, 54 can emit a white light combination of different color temperatures. It is understood that more or less than three LEDs can be utilized in a package according to the present invention, with the LEDs emitting any desired color.

The package 10 can also comprise elements to protect against damage from electrostatic discharge (ESD). Different elements can be used such as various vertical Zener diodes, different LEDs arranged in parallel and reverse biased to the LED chips 50, 52, 54, surface mount varistors, and lateral Si diodes. In embodiments using a Zener diode, it can be mounted to a separate attach pad using known mounting techniques. The diode may be relatively small so it does not cover an excessive area on the surface of the bond pad exposed by the cavity 40. When utilizing groups of LEDs coupled in series only one ESD element is needed for each series group.

LED structures, features, and their fabrication and operation are generally known in the art and only briefly discussed herein. LEDs can have many different semiconductor layers arranged in different ways and can emit different colors. The layers of the LEDs can be fabricated using known processes, with a suitable process being fabrication using metal organic chemical vapor deposition (MOCVD). The layers of the LED chips generally comprise an active layer/region sandwiched between first and second oppositely doped epitaxial layers, all of which are formed successively on a growth substrate or wafer. LED chips formed on a wafer can be singulated and used in different application, such as mounting in a package. It is understood that the growth substrate/wafer can remain as part of the final singulated LED or the growth substrate can be fully or partially removed.

It is also understood that additional layers and elements can also be included in the LEDs, including but not limited to buffer, nucleation, contact and current spreading layers as well as light extraction layers and elements. The active region can comprise single quantum well (SQW), multiple quantum well (MQW), double heterostructure or super lattice structures.

The active region and doped layers may be fabricated from different material systems, with one such system being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a possible embodiment, the doped layers are gallium nitride (GaN) and the active region is InGaN. In alternative embodiments the doped layers may be AlGaN, aluminum gallium arsenide (AlGaAs) or aluminum gallium indium arsenide phosphide (AlGaInAsP) or aluminum indium gallium phosphide (AlInGaP) or zinc oxide (ZnO).

The growth substrate/wafer can be made of many materials such as silicon, glass, sapphire, silicon carbide, aluminum nitride (AlN), gallium nitride (GaN), with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022.

LEDs can also comprise additional features such as conductive current spreading structures, current spreading layers, and wire bond pads, all of which can be made of known materials deposited using known methods. Some or all of the LEDs can be coated with one or more phosphors, with the phosphors absorbing at least some of the LED light and emitting a different wavelength of light such that the LED emits a combination of light from the LED and the phosphor. LED chips can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. Alternatively, the LEDs can be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference.

Furthermore, LEDs may have vertical or lateral geometry as is known in the art. Those comprising a vertical geometry may have a first contact on a substrate and a second contact on a p-type layer. An electrical signal applied to the first contact spreads into the n-type layer and a signal applied to the second contact spreads into a p-type layer. In the case of Group-III nitride devices, it is well known that a thin semitransparent typically covers some or the entire p-type layer. It is understood that the second contact can include such a layer, which is typically a metal such as platinum (Pt) or a transparent conductive oxide such as indium tin oxide (ITO).

Figure 2:
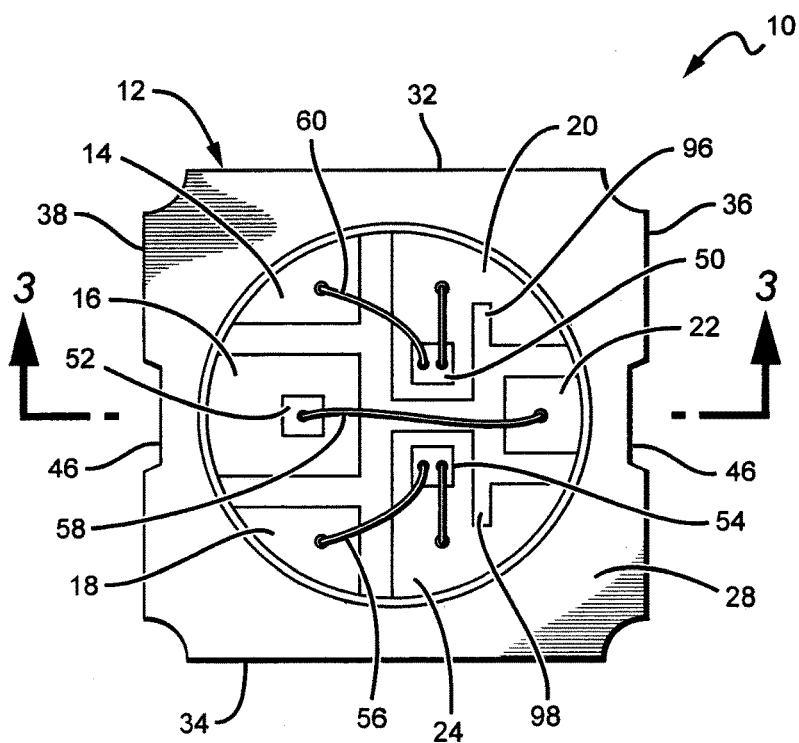
FIG. 2 is a top plan view of the embodiment shown in FIG. 1.

LEDs may also comprise a lateral geometry, wherein both contacts are on the top of the LEDs (as shown in FIGS. 1 and 2). A portion of the p-type layer and active region is removed, such as by etching, to expose a contact mesa on the n-type layer. A second lateral n-type contact is provided on the mesa of the n-type layer. The contacts can comprise known materials deposited using known deposition techniques.

Figure 4:
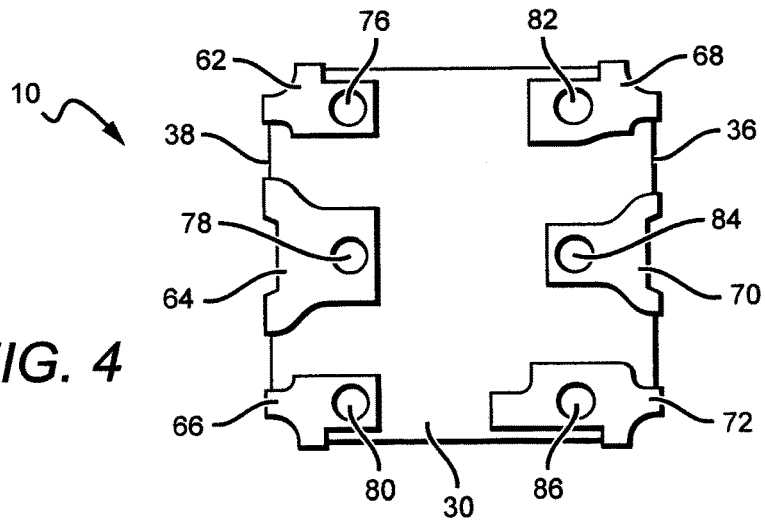
FIG. 4 is a bottom view of the embodiment shown in FIG. 1.
Figure 5A:
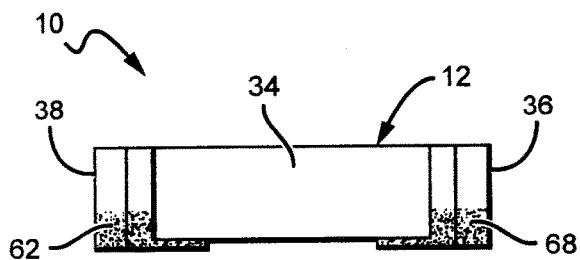
Figure 5B:
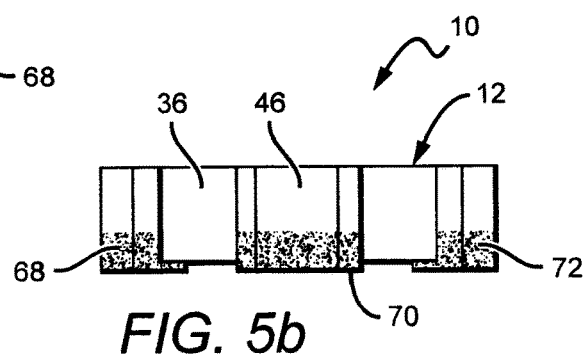
Figure 6:
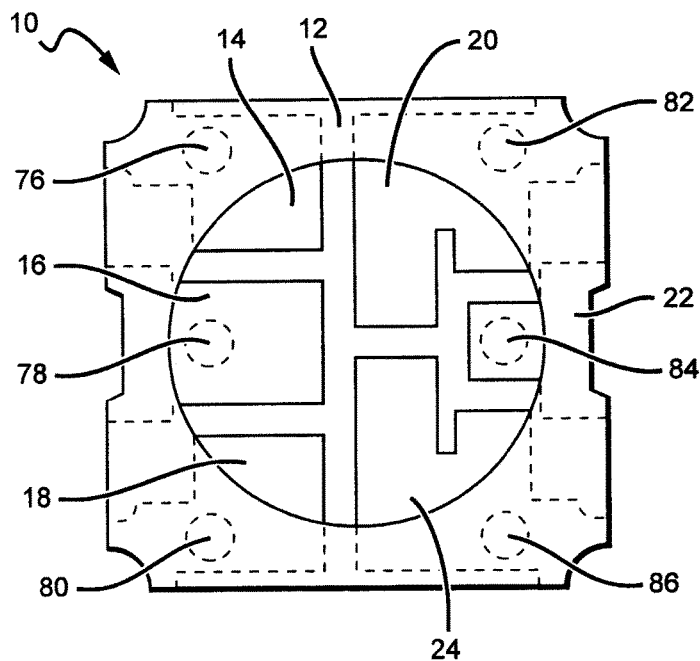
FIG. 6 is a top view of an LED package in accordance with one embodiment that may be used in the device of FIG. 1.
Figure 7:
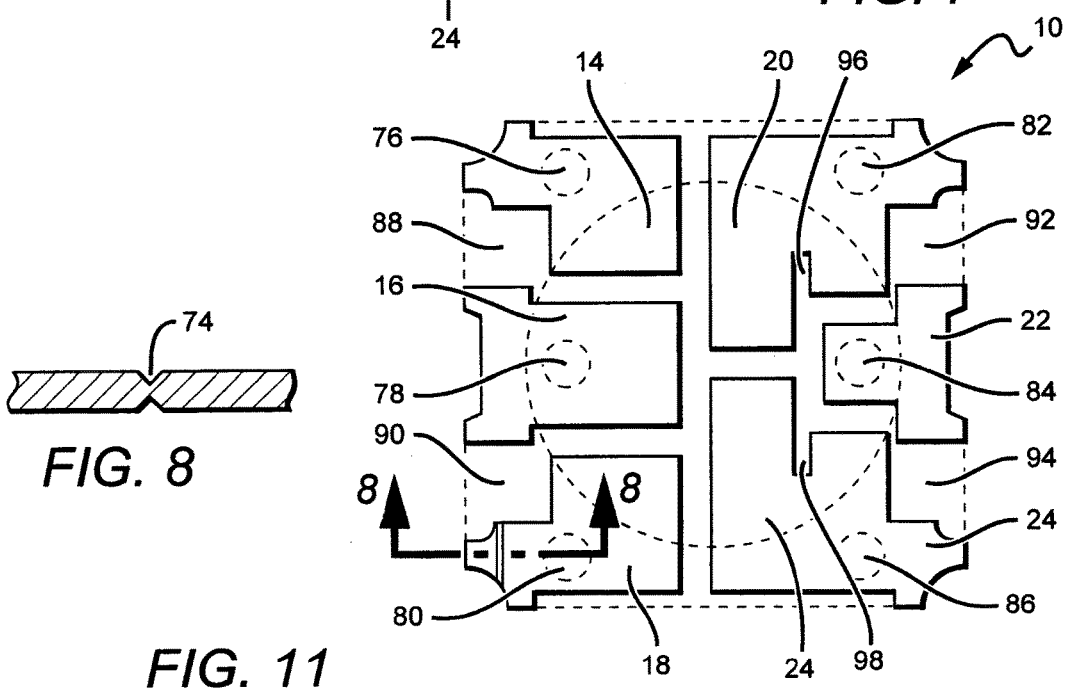
FIG. 7 is a top view of the bond pads in accordance with one embodiment that may be used in the device of FIG. 1.
Figure 8:
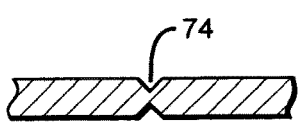
FIG. 8 is a cross section view of one possible embodiment for a package integrity stabilizing mechanism as seen along the line 8-8 in FIG. 7.
Figure 11:
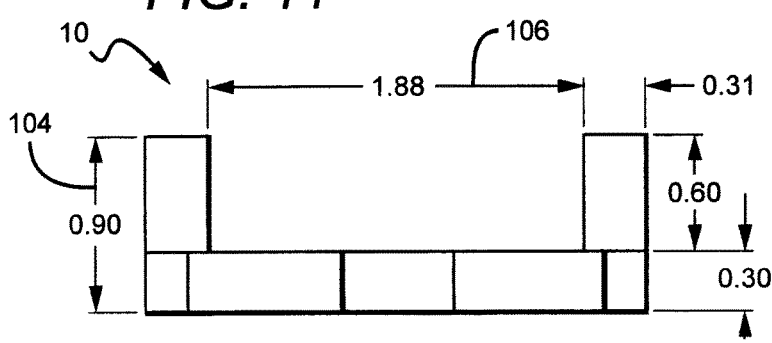
FIG. 11 is a side dimensional view of one embodiment according to the present invention.

In the illustrative embodiment shown, the electrodes 62, 64, 66, 68, 70, and 72 are plated/disposed on portions of the bottom 30 and side surfaces 32, 34, 36, and 38 of the casing 12 (see FIGS. 4-5*b*). The electrodes are arranged to operate in anode and cathode pairs to conduct an electrical signal to their respective light emitter when the package 10 is surface mounted for operation. In the embodiment shown, the electrodes are physically isolated from the bond pads and their respective light emitting devices, but are electrically connected to the bond pads via the through-holes 76, 78, 80, 82, 84, and 86. The electrodes are substantially flush with the bottom of the casing 12 to facilitate connection to an underlying mechanical/electronic support structure 95 such as a PCB. The electrodes are also substantially flush with the side surfaces of the casing 12 to facilitate dense packing of emitter packages when they are adjacently arranged for a display.

Figure 3:
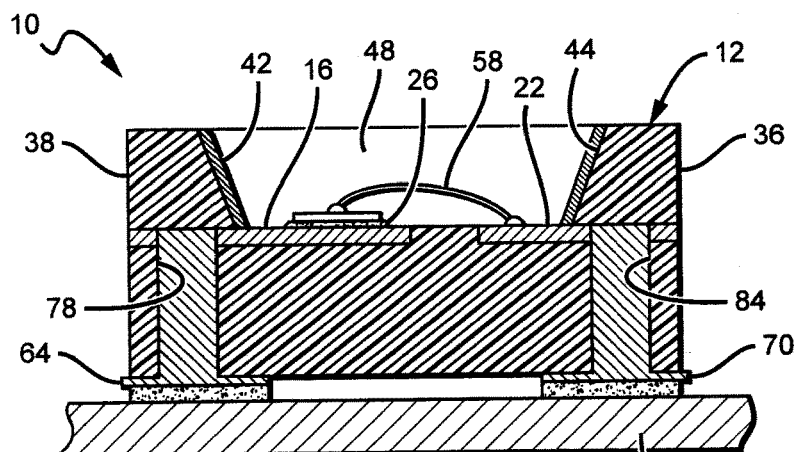
FIG. 3 is a cross section view of the embodiment of FIG. 1 as seen along the line 3-3 in FIG. 2.

As best shown in FIG. 3, the electrodes 68, 70, 72, 76, 78, and 80 (with only electrodes 64 and 70 being visible) can be electrically connected or bonded to traces or pads on the support structure 95 using any of a number of well-known connection techniques, including soldering. The same methods can be utilized for electrically connecting adjacent emitter packages via the electrode portions at the side surfaces when the packages are placed next to one another for use in displays and the like.

The chip carrier portions of the bond pads comprise mounting pads for carrying the LED chips 50, 52, in a non-linear array as shown. This alignment allows for improved color mixing between the LED chips compared to packages having LEDs arranged in linear fashion. It is understood that a non-linear array arranged differently than depicted would also allow for improved color mixing and is contemplated by the present invention.

The chip carrier portions of the bond pads may extend toward the center of the casing 12, which allows for the LEDs 50, 52, 54 to be mounted closer to the center of the casing 12 so they can emit out of the cavity 40. The bond pads also include electrical connection portions (shown here as pads 14, 18, and 22) positioned adjacent to, but spaced apart from, the chip carrier portions 68, 70, 72 via gaps between the pads.

As best seen in FIGS. 1 and 2, the cavity 40 extends into the casing interior a sufficient depth to expose the chip carrier and connection portions of the bond pads 14, 16, 18, 20, 22, and 24. In a possible embodiment, each of the LEDs 50, 52, 54 has its own pair of contacts or electrodes arranged so that when an electrical signal is applied across the contacts, the LED emits light. The contacts of the LEDs are electrically connected to an anode and cathode part pair. Ensuring that each of the LEDs 50, 52, 54 has its own cathode and anode pair can be advantageous for a number of reasons, such as providing easier electrical control of each LED.

In accordance with a typical implementation of the embodiments shown, one of the contacts of LEDs 50, 52, is coupled to the chip carrier portions of the bond pads, while the other of LEDs 50, 52, 54 contacts is coupled to the connection portions of the bond pads. However, it is understood that the connection portions can carry the chips instead, with the connection portion being electrically connected to the chip carrier parts. Different known structures and methods can be used for making this connection, with one such structure being wire bonds 56, 58, 60 applied using known methods. Although one possible wire bond configuration is shown, it is understood that various, other suitable wire bond configurations are possible depending on the structure of each chip. For example, there may be more than one wire bonds on one chip, with one wire bond attached to a connection pad, and the other wire bond attached to a chip carrier pad.

The electrodes 62, 64, 66, 68, 70, 72 may be made from an electrically conductive metal or metal alloy, such as copper, a copper alloy, silver (Ag), a silver alloy, and/or other suitable electrically conductive, low resistivity, corrosion resistant materials or combinations of materials. The bonding pads may also be comprised of such materials. As noted, the thermal conductivity of the bond pads and electrodes may assist, to some extent, in conducting heat away from the LEDs 50, 52, 54 carried by the SMD. However, in lower power packages (such as those operating at ~20-60 mA) of the present embodiment, thermal management may not be a key concern.

Each of the LEDs 50, 52, 54 may be electrically coupled with its respective chip carrier portion of a bond pad by means of an electrically and thermally conductive bonding material 26 such as a solder, adhesive, coating, film, encapsulant, paste, grease and/or other suitable material. In one embodiment, the LEDs may be electrically coupled and secured to their respective pads using a solder pad on the bottom of the LEDs. The fabrication of the bond pads and electrodes may be accomplished by stamping, injection molding, cutting, etching, bending or through other known methods and/or combinations of methods to achieve the desired configurations. For example, bond pads can be partially metal stamped (e.g., stamped simultaneously from a single sheet of relevant material), appropriately shaped, and finally fully separated following the formation of some or all of the casing.

In some methods of manufacturing the LEDs may be coupled to the chip carrier parts prior to molding and/or assembling the casing 12 about the bond pads. Alternatively, the LEDs may be coupled to the bond pads 68, after they have been partially encased within the casing. The cavity 40 that extends into the casing may be configured so that sufficient portions of the bond pads are exposed to receive the LEDs and the associated wire bonds, and to allow the LEDs to emit light out through the cavity 40.

In conventional packages, the smooth surfaces and narrow paths between the bond pads and the upper and lower portions of the casing make reliable adhesion difficult. These smooth surfaces and narrow paths between the metal gaps of the bond pads can reduce the structural integrity of the emitter package and can increase the chances of component failure by separation of the casing from the bond pads during both use and manufacturing processes. To make the package more robust, the structural integrity of the package is improved by increasing adhesion reliability between the casing and bond pads. This can be accomplished with one or more of the bond pads including one or more indentations (such as the V-cuts 74 shown in FIG. 8), through-holes, indentations, extensions, and/or other features that contribute to the stability, integrity and/or robustness of the SMD package. Furthermore, metal gaps 88, 90, 92, and 94 may be provided at various locations between adjacent bond pads, with these gaps having greater and varying widths than the narrow paths seen in conventional emitter packages. Indentations such as 96 and 98 may also be provided to provide additional paths for casing material to occupy. The gaps and indentations are later filled with casing material to form thicker paths and/or path segments and additional paths between these bond pad portions compared to packages not comprising the larger metal gaps and indentation features.

When casing material is molded over bond pads 14, 16, 18, 20, 22, and 24, it fills in larger metal gaps 88, 90, 92, 94 and indentations 96, 98 to improve the adhesion between casing 12 and the bond pads and improve the overall structural integrity/robustness of package 10. The electrodes may also contain such features. The stabilizing features of the bond pads may also cooperate with the fill material/encapsulant, at least in part, to enhance the structural stability and integrity of the package 10. The casing material and/or fill material/encapsulant extends at least partially into and/or through such features of the lead frame to add robustness. Without these types of features for improving the structural integrity of the package, packages can be damaged during fabrication or the lead frame and casing can dissociate during package operation.

Figure 9:
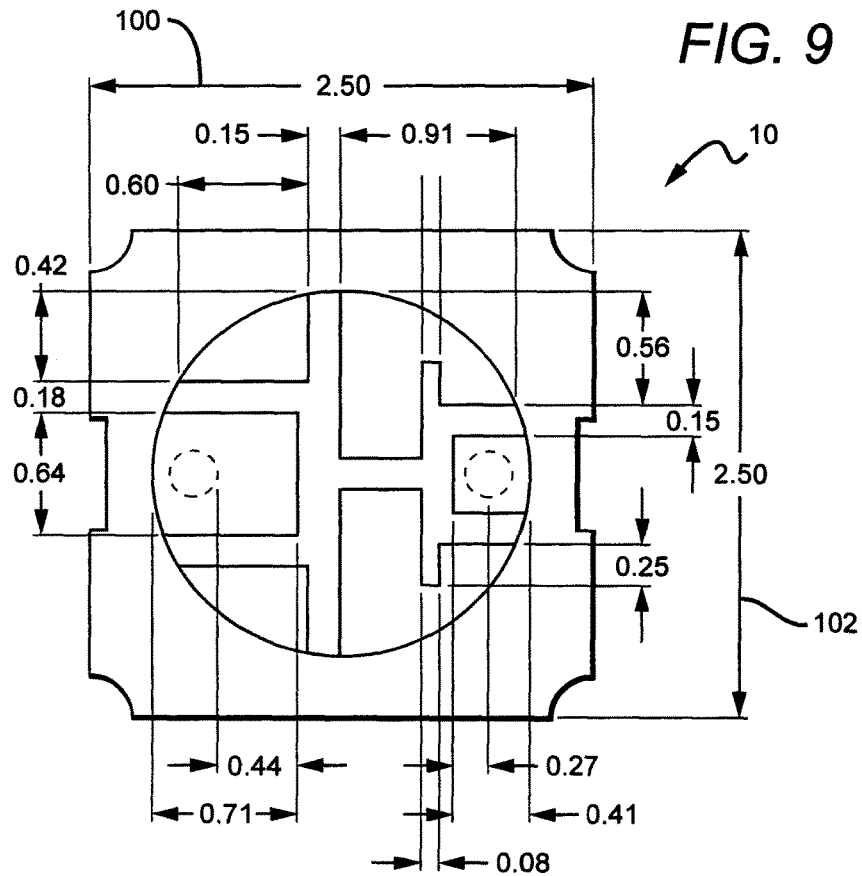
FIG. 9 is a top dimensional view of an LED package according to the present invention.
Figure 10:
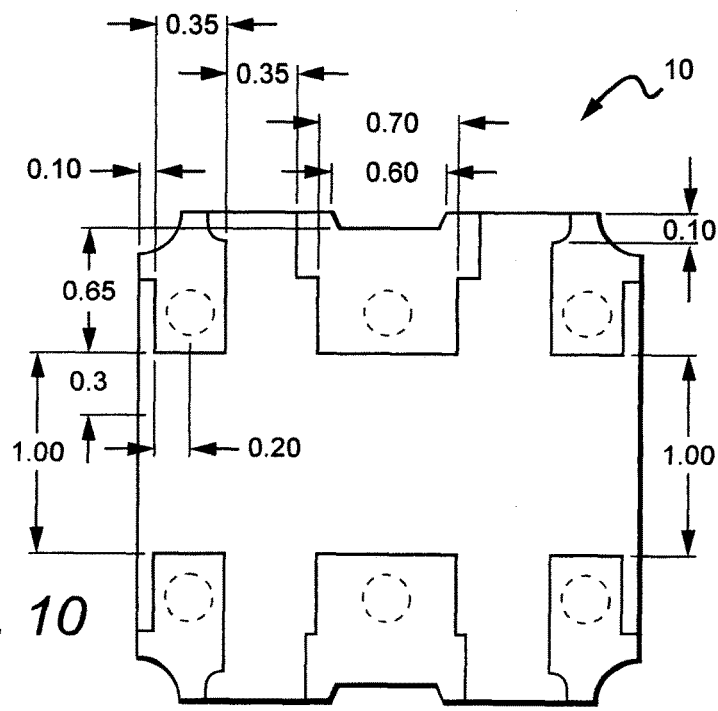
FIG. 10 is a bottom dimensional view of an LED package according to the present invention.

With reference now to FIGS. 9-10, some examples of dimensional characteristics of the various components of emitter package 10 are shown. By way of example and not limitation, the package 10 may have an overall length 100 of 2.50 mm, an overall width 112 of 2.50 mm, and a height 104 of 0.90 mm. In other embodiments, the length may be less than 2.50 mm, less than 2.0 mm, or greater than 2.50 mm. The overall width may be less than 2.50 mm, less than 2.0 mm, or greater than 2.50 mm. According to possible embodiments for a thin/low profile emitter package, the height/thinness of the package may range from 0.9-1.0 mm, may be less than 0.90 mm, or may be less than 1.0 mm.

In an LED display according to the present invention, a driver PCB may be provided, upon which a large number of SMDs according to the present invention may be mounted. The SMDs may be arranged in rows and columns, with each SMD defining a pixel. The SMDs may comprise emitter packages such as those embodied by package 10. The SMDs may be electrically connected to traces or pads on a PCB and to each other via pads on their side surfaces, with the PCB connected to respond to appropriate electrical signal processing and driver circuitry.

As disclosed above, each of the SMDs carries a non-linear array of blue, red and green LEDs. A non-linear orientation of the LEDs has been found to improve color mixing of the light emitted from the various LEDs. However, it is understood that each SMD may alternatively carry various linearly-oriented arrays of LEDs. The LEDs may be arranged in any order, and less than or more than three LEDs in any desired color combination may be provided in accordance with the present invention.

While several illustrative embodiments of the invention have been shown and described, numerous variations and alternate embodiments will occur to those skilled in the art, such as utilizing the present invention for LED decorative lighting or the like. Such variations and alternate embodiments are contemplated, and can be made without departing from the spirit and scope of the invention as defined in the appended claims.

We claim:

1. An emitter package, comprising:
    a casing comprising a cavity extending into the interior of said casing from a top surface of said casing;
    electrically conductive bond pads integral to said casing, wherein a first set of said bond pads comprises chip carrier parts, and a second set of said bond pads comprises connection parts;
    a plurality of light emitting devices (LEDs) on said first set of bond pads, with said light emitting devices and portions of said bond pads exposed through said cavity;
    a plurality of electrodes at least on the bottom surface of said casing; and
    through-holes integral to each of said bond pads, wherein said through-holes are embedded within said casing and extend into each of said bond pads and said electrodes to provide electrical paths between said bond pads and said electrodes;
    wherein at least one of said chip carrier parts or connection parts is at least partially defined by an indentation.

2. The emitter package of claim 1, wherein said electrodes comprise:
    a plurality of electrically conductive cathode parts; and
    a corresponding plurality of electrically conductive anode parts separate from said cathode parts;
    wherein each of said cathode and anode parts are electrically connected to one of said light emitting devices.

3. The emitter package of claim 1, wherein said light emitting devices are adapted to be energized to produce, in combination, a substantially full range of colors.

4. The emitter package of claim 2, wherein each of said light emitting devices comprises at least two contacts, one of which is electrically coupled to at least one of said cathode parts, and the other of which is electrically coupled to at least one of said anode parts.

5. The emitter package of claim 1, wherein said bond pads and said electrodes are comprised of an electrically conductive metal or metal alloy.

6. The emitter package of claim 5, wherein said electrodes are comprised of Ag or an Ag alloy.

7. The emitter package of claim 1, wherein said light emitting devices comprise red, blue and green LEDs.

8. The emitter package of claim 1, wherein each of said light emitting devices is attached to one of said chip carrier parts via solder and one of said connection parts via a wire bond.

9. The emitter package of claim 1, wherein said casing is comprised of white ceramic, with the white ceramic aiding in the color mixing of said light emitting devices.

10. The emitter package of claim 1, wherein said bond pads comprise features that cooperate with said casing to provide a connection between said bond pads and said casing and wherein said features improve the structural integrity of the overall package.

11. The emitter package of claim 1, wherein said chip carrier portions extend toward the center of said casing.

12. The emitter package of claim 1, further comprising an encapsulant over said package.

13. The emitter package of claim 12, wherein said encapsulant is UV-resistant and comprises silicone.

14. The emitter package of claim 12, wherein the top of said encapsulant is substantially flat.

15. The emitter package of claim 1, wherein said cavity comprises a reflector.

16. The emitter package of claim 1, wherein the height of said package is less than or equal to 0.9 mm.

17. The emitter package of claim 1, further comprising one or more Zener diodes electrically connected to said exposed bond pad portions and said light emitting devices.

18. The emitter package of claim 1, wherein one or more of the side surfaces of said package comprise U-shaped indentations to reduce the amount of electrode material on said side surfaces.

19. The emitter package of claim 1, wherein said casing is plated by said electrodes on portions of its bottom surface and portions of one or more of its side surfaces.

20. The emitter package of claim 19, wherein said plated portions further comprise solder pads such that said solder pads are on both the bottom and side surfaces of said package.

21. The emitter package of claim 20, wherein said solder pads at the bottom surface of said casing connect said package to a printed circuit board, and said solder pads at the side surfaces of said casing connect said package to one or more adjacent packages.

22. A ceramic emitter package, comprising:
a casing comprising a cavity extending into the interior of said casing from a top surface of said casing;
electrically conductive bond pads integral to said casing, wherein a first set of said bond pads comprises chip carrier parts, and a second set of said bond pads comprises connection parts, said bond pads comprising through-holes integral to each of said bond pads, wherein said through-holes are embedded within said casing and extend into each of said bond pads and a respective one of a plurality of electrodes;
a plurality of light emitting devices (LEDs) on said first set of bond pads, with said light emitting devices and portions of said bond pads exposed through said cavity;
said plurality of electrodes at least on the bottom surface of said casing; and
one or more U-shaped indentations in a first side surface of said casing;
wherein a portion of a first of said electrodes is substantially flush with said first side surface; and
wherein a majority of said portion is within said one or more U-shaped indentations.

23. The emitter package of claim 22, wherein said through-holes provide electrical paths between said bond pads and said electrodes.

24. The emitter package of claim 22, wherein said electrodes comprise:
a plurality of electrically conductive cathode parts; and
a corresponding plurality of electrically conductive anode parts separate from said cathode parts, each of said cathode parts and anode parts electrically connected to one of said bond pads;
wherein each of said light emitting devices is attached to one of said chip carrier parts via solder and one of said connection parts via a wire bond, with said through-holes in said bond pads providing electrical paths between said bond pads and said electrodes.

25. The emitter package of claim 22, wherein said light emitting devices comprise multiple color LEDs adapted to be energized to produce, in combination, a substantially full range of colors.

26. The emitter package of claim 22, wherein said electrodes are comprised of Ag or an Ag alloy.

27. The emitter package of claim 22, further comprising features integral to one or more of said bond pads to improve the connection between said bond pads and said casing, said features comprising one or more of: said through-holes, cuts, gaps between adjacent portions of said bond pads, and indentations in portions of said bond pads.

28. The emitter package of claim 22, further comprising a silicone encapsulant over said package, with the top of said encapsulant being substantially flat.

29. The emitter package of claim 22, wherein said cavity comprises a reflector.

30. The emitter package of claim 22, wherein the height of said package is less than or equal to 1.0 mm.

31. The emitter package of claim 22, wherein said casing is plated by said electrodes on portions of its bottom surface and portions of one or more of its side surfaces, with said plated portions further comprising solder pads such that said solder pads are on both the bottom and side surfaces of said package, wherein said solder pads at the bottom surface of said casing connect said package to a printed circuit board, and said solder pads at the side surfaces of said casing connect said package to one or more adjacent packages.

32. A low profile emitter package, comprising:
a ceramic casing comprising a cavity extending into the interior of said casing from a top surface of said casing;
electrically conductive bond pads, each of which is integral to and extends to at least one of a plurality of side surfaces of said casing, wherein a first set of said bond pads comprises chip carrier parts, and a second set of said bond pads comprises connection parts, the top and bottom surfaces of said bond pads embedded in said casing at said side surfaces;
a plurality of light emitting devices (LEDs) on said first set of bond pads, with said LEDs and portions of said bond pads exposed through said cavity;
a plurality of electrodes each comprising a first portion on a bottom surface of said casing and a second portion on at least one of said side surfaces of said casing; and
through-holes integral to each of said bond pads, said through-holes extending from said bond pads through said casing to provide electrical paths between said bond pads and said electrodes, wherein said electrical paths are surrounded by said casing on all sides, wherein said through-holes extend through each of said first portions of said electrodes;
wherein the height of said package is less than or equal to 1.0 mm; and
wherein the majority of at least one of said second portions is within a U-shaped indentation in one of said side surfaces of said casing.

33. The emitter package of claim 32, wherein one or more of the side surfaces of said casing comprise U-shaped indentations to reduce the amount of electrode material on said side surfaces.

34. The emitter package of claim 32,
wherein each of said LEDs is attached to one of said chip carrier parts via solder and one of said connection parts via a wire bond.

35. The emitter package of claim 32, wherein said LEDs comprise red, blue and green LEDs adapted to be energized to produce, in combination, a substantially full range of colors.

36. The emitter package of claim 32, further comprising features in said bond pads to improve the connection between said bond pads and said casing, said features comprising one or more of: said through-holes, cuts, gaps between adjacent portions of said bond pads, and indentations in portions of said bond pads.

37. The emitter package of claim 32, wherein said casing is plated by said electrodes on portions of its bottom surface and portions of one or more of its side surfaces, with said plated portions further comprising solder pads such that said solder pads are on both the bottom and side surfaces of said package, wherein said solder pads at the bottom surface of said casing connect said package to a printed circuit board, and said solder pads at the side surfaces of said casing connect said package to one or more adjacent packages.

38. The emitter package of claim 32, wherein each of said electrodes is physically isolated from each of said bond pads, but is electrically connected to at least one of said bond pads by at least one of said through-holes.

39. The emitter package of claim 32, wherein each of said bond pads terminates at one or more of said plurality of side surfaces.

40. The emitter package of claim 32, wherein each of said electrodes extends past an outer perimeter of said casing such that said second portions of said electrodes are at least partially outside said outer perimeter of said casing.

41. The emitter package of claim 40, wherein said second portions of said electrodes extend to said top surface of said casing.

42. The emitter package of claim 32, wherein said second portions of said electrodes extend to said top surface of said casing.

\* \* \* \* \*